(12) United States Patent
Lachner et al.

(10) Patent No.: US 8,624,381 B2
(45) Date of Patent: Jan. 7, 2014

(54) INTEGRATED ANTENNAS IN WAFER LEVEL PACKAGE

(71) Applicant: Infineon Technologies AG, Neubiberg (DE)

(72) Inventors: Rudolf Lachner, Ingolstadt (DE); Linus Maurer, Linz (AT); Maciej Wojnowski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/849,034

(22) Filed: Mar. 22, 2013

(65) Prior Publication Data

US 2013/0207262 A1    Aug. 15, 2013

Related U.S. Application Data

(63) Continuation of application No. 13/622,058, filed on Sep. 18, 2012, now Pat. No. 8,460,967, which is a continuation of application No. 12/645,969, filed on Dec. 23, 2009, now Pat. No. 8,278,749.

(60) Provisional application No. 61/148,584, filed on Jan. 30, 2009.

(51) Int. Cl.
*H01L 23/00*    (2006.01)

(52) U.S. Cl.
USPC .... 257/698; 258/684; 258/693; 258/E21.499; 258/E21.522; 258/E21.533; 258/E21.575; 258/E23.129; 258/E23.178; 438/106; 438/124; 438/584; 438/622; 438/652

(58) Field of Classification Search
USPC .......... 257/684, 693, 698, E23.129, E23.178, 257/E21.499, E21.522, E21.533, E21.575; 438/106, 124, 584, 622, 652
See application file for complete search history.

(56) References Cited

U.S. PATENT DOCUMENTS

2007/0026567 A1 *   2/2007   Beer et al. ..................... 438/106

* cited by examiner

*Primary Examiner* — Peniel M Gumedzoe
(74) *Attorney, Agent, or Firm* — SpryIP, LLC

(57) ABSTRACT

A semiconductor module, comprises a package molding compound layer comprising an integrated circuit (IC) device embedded within a package molding compound, the integrated circuit device and the package molding compound having a common surface. Structures are formed to connect the semiconductor module to an external board, the structures electrically connected to the integrated circuit device. A layer is formed on the common surface, the layer comprising at least one integrated antenna structure, the integrated antenna structure being coupled to the IC device.

13 Claims, 6 Drawing Sheets

INTEGRATED ANTENNAS IN WAFER LEVEL PACKAGE

REFERENCE TO RELATED APPLICATIONS

The present disclosure relates generally to methods and systems related to radio frequency (RF) communication devices This application claims the benefit of the priority date of U.S. provisional application No. 61/148,584 filed on Jan. 30, 2009 and U.S. application Ser. No. 12/645,969 filed on Dec. 23, 2009 the contents of which are herein incorporated by reference. This application is a continuation of U.S. patent application Ser. No. 13/622,058 which is a continuation of U.S. patent application Ser. No. 12/645,969 now U.S. Pat. No. 8,278,749.

FIELD

The present disclosure relates generally to methods and systems related to radio frequency (RF) communication devices.

BACKGROUND

In millimeter wave radar systems (e.g. as for automotive safety and comfort applications) antenna structures are placed on high frequency substrates or high frequency printed circuit boards (HF PCBs), increasing the overall cost of design due to the extra high expense of such high frequency substrates. Antennas such as microstrip antennas (e.g. patch antennas) are often built on these special high frequency substrates. HF PCBs are often constructively based on Rogers, Taconic or other PTFE materials.

Millimeter wave output power can be generated on a semiconductor monolithic microwave integrated circuit (MMIC), which may be located also on the HF PCB. MMIC devices typically perform functions such as microwave mixing, power amplification, low noise amplification, and high frequency switching. The inputs and outputs on MMIC devices are frequently matched to a characteristic impedance (e.g. 50 ohms) and interconnect to an antenna. These interconnections between MMIC devices and antenna generally involve a lossy chip/board interface (e.g. bond wires).

Whenever a source of power, such as MMIC devices, delivers power to a load, the power is delivered most efficiently when the impedance of the load is equal to or matches the complex conjugate of the impedance of the source (impedance matching). For two impedances to be complex conjugates, their resistances are equal, and their reactance are equal in magnitude but of opposite signs. Such impedance matching between antennas and chip output can suffer from large manufacturing tolerances of the bonding process and on printed circuit board (PCB) wiring.

Because of a large demand for efficient, less expensive, and cost-effective radar sensing, suppliers face the challenge of delivering antenna packages with maximum potential range, data rate and power integrated in the same radar system.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

A semiconductor module, comprises a package molding compound layer comprising an integrated circuit (IC) device embedded within a package molding compound, the integrated circuit device and the package molding compound having a common surface. Structures are formed to connect the semiconductor module to an external board, the structures electrically connected to the integrated circuit device. A layer is formed on the common surface, the layer comprising at least one integrated antenna structure, the integrated antenna structure being coupled to the IC device.

DETAILED DESCRIPTION

Figure 1A:
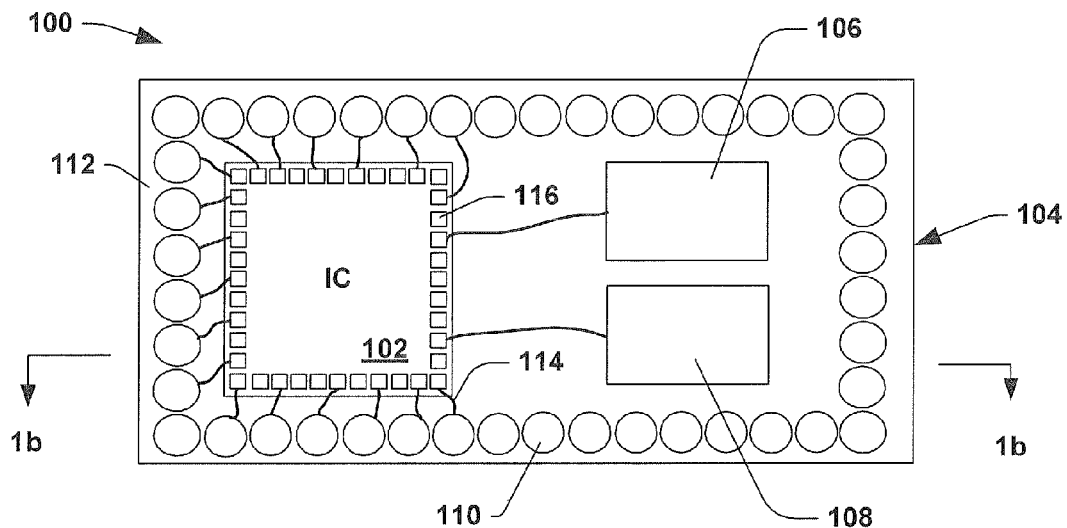
FIG. 1a illustrates a top view of a semiconductor module of one embodiment of the present disclosure.

One or more implementations of the present invention will now be described with reference to the attached drawings, wherein like reference numerals are used to refer to like elements throughout.

Integrated wafer packages can be integrated with antenna structures that are coupled to an integrated circuit (IC) chip through a feed structure that is directly connected to the chip and without a bonding interface structure that is external to bond pad connections of the IC device. For example, at least one antenna can be integrated with the chip through an interface layer comprising a metallization layer (e.g. redistribution layer) coupled to a package molding compound with the chip embedded therein. The interface layer integrates the antenna components directly within the same package and can further comprise three dimensional interconnect structures (e.g. solder balls) configured to connect the chip externally. Expensive high frequency substrates and lossy interfaces can thereby be eliminated for integrating antennas into a package in high frequency applications (e.g. millimeter waver radar sensing).

FIG. 1a illustrates a top view of a semiconductor module 100 with integrated antenna structures, according to an exemplary embodiment of the disclosure, and integrally packaged with an integrated circuit (IC) chip 102 for wireless communication. For example, the module 100 can comprise integrated antenna structures 106 and 108 embedded therein and integrated to the IC chip 102. Although two antenna structures 106 and 108 are illustrated herein, the disclosure is not limited to any specific number of antenna structures. The module 100 therefore comprises at least one integrated antenna structure for transmitting/receiving communication signals (e.g., millimeter wave output signals).

The semiconductor module 100 can comprise a wafer package 104, for example, an embedded wafer level ball grid array (eWLB) package 104 comprising the IC chip 102. The IC chip 102 can be any kind of integrated circuit chip such as any silicon chip that is embedded within the package 104. For example, the IC chip 102 may be a monolithic microwave integrated circuit (MMIC) chip for microwave engineering processes. MMIC devices typically perform functions such as microwave mixing, power amplification, low noise amplification, and high frequency switching. MMICs are dimensionally small (from around 1 mm$^2$ to 10 mm$^2$) and can be mass produced, which has allowed the proliferation of high frequency devices such as cellular phones. MMICs have fundamental advantages, namely transistor device speed and a semi-insulating substrate. Both factors can help with the design of high frequency circuit functions.

The wafer package 104 can comprise three dimensional (3D) bonding interconnect/interface structures 110, such as solder balls that may be surface-mountable in nature. The 3D bonding interconnect structures 110 can provide external contacts, mechanical support and/or spacing between the wafer package 104 and external contacts (e.g., package leads on a printed circuit board). For example, the 3D interconnect structures 110 can provide electrical connections between active components of the IC chip 102 or external components. The interconnect structures can comprise various bonding materials, such as bonding metals (e.g. Sn, Ag, and/or Cu).

The wafer package 104 can comprise a package mold compound 112 in which the IC chip 102 and solder balls 110 can be integrated within and/or encapsulated on at least one side by the mold compound. The IC chip 102 comprises bond pads or contact pads 116 on a surface of the chip for making electrical connections from the chip 102 to contacts (e.g., via bond wires 114).

The distance of contact pads 116 and the silicon there between can be about 0.1 mm, and thus, connecting to a printed circuit board is effectively done with bond wires 114 rather than through direct contact. The bond wires 114 may interconnect the contact pads 116 of the IC chip 102 to the 3D bonding interface structures 110.

The integrated antenna structure 106 and integrated antenna structure 108 may be used to transmit and/or receive wireless communication signals thereto to form a transceiver device. While the integrated antenna structure 106 and 108 are illustrated as two separate antenna structures, they may also be one antenna structure acting as a transceiver for transmission and/or reception thereat. Additionally, more than two antenna structures may be integrated into the package 104 and positioned in various angels for an optimized performance and minimizing mutual coupling.

Figure 3A:
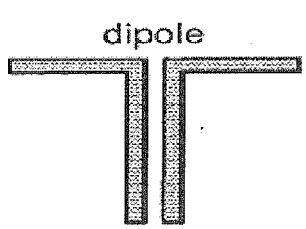
FIGS. 3a-3f illustrate various embodiments of antenna structures for the present disclosure.
Figure 3B:
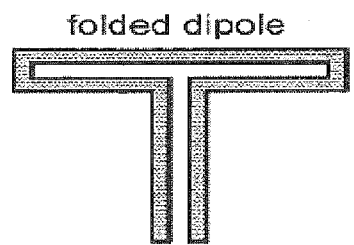
Figure 3C:
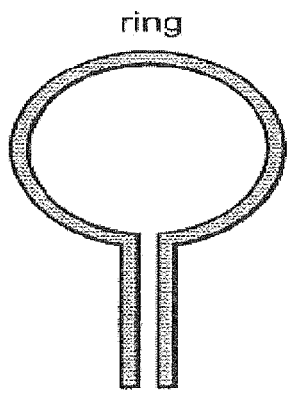
Figure 3D:
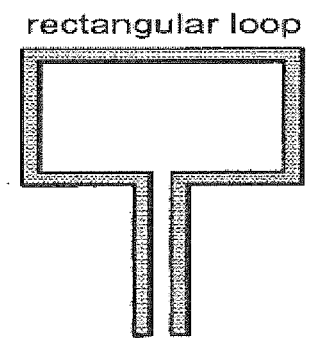
Figure 3E:
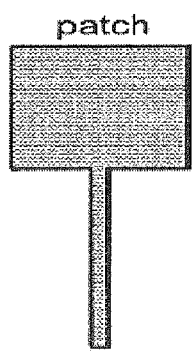
Figure 3F:
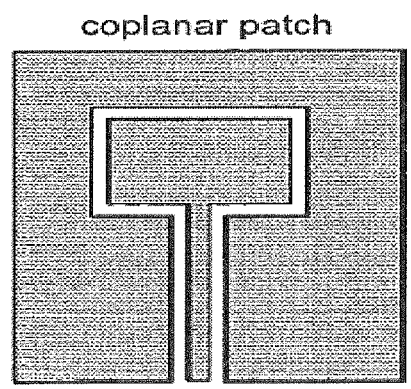

The integrated antenna structure(s) can also comprise any one of a various types of planar antennas. For example, the antenna structures 106 and/or 108 may comprise a dipole antenna (FIG. 3a), a folded dipole antenna (FIG. 3b), a ring antenna (FIG. 3c) a rectangular loop antenna (FIG. 3d), a patch antenna (FIG. 3e), a coplanar patch antenna (FIG. 3f), monopole antennas, etc., in addition to one or more of various types of antenna feed and/or impedance matching networks, such as balanced differential lines, coplanar lines, etc. in which one of ordinary skill in the art would appreciate.

In one embodiment, the integrated antenna structure 106 and/or 108 can be integrated into the package 104 with the chip 102 and package mold compound 112. For example, the integrated antenna 106 and/or 108 can be integrated into the same layer as the 3D interconnect structures 110 (e.g. solder balls) through an interface layer comprising redistribution or metallization layer (discussed infra). This can enable the antennas to be contacted to the silicon chip 102 within package 104 without a bonding interface structure that is external to bond pad connections 116 of the IC device. Because the package 104 comprises one common surface where the packaged mold compound 112 and chip 102 are combined in one wafer package 104, the interconnection between the antenna structures 106, 108 and silicon chip 102 can be done in one wafer fabrication process flow. Thus, the cost of expensive high frequency substrates, often utilized for wave radar systems (e.g. millimeter waver radar systems, as for automotive safety and comfort applications) can be avoided. Additionally, impedance matching between antennas and chip output does not have to suffer from large tolerances of the bonding process and on printed circuit board wiring.

Figure 1B:
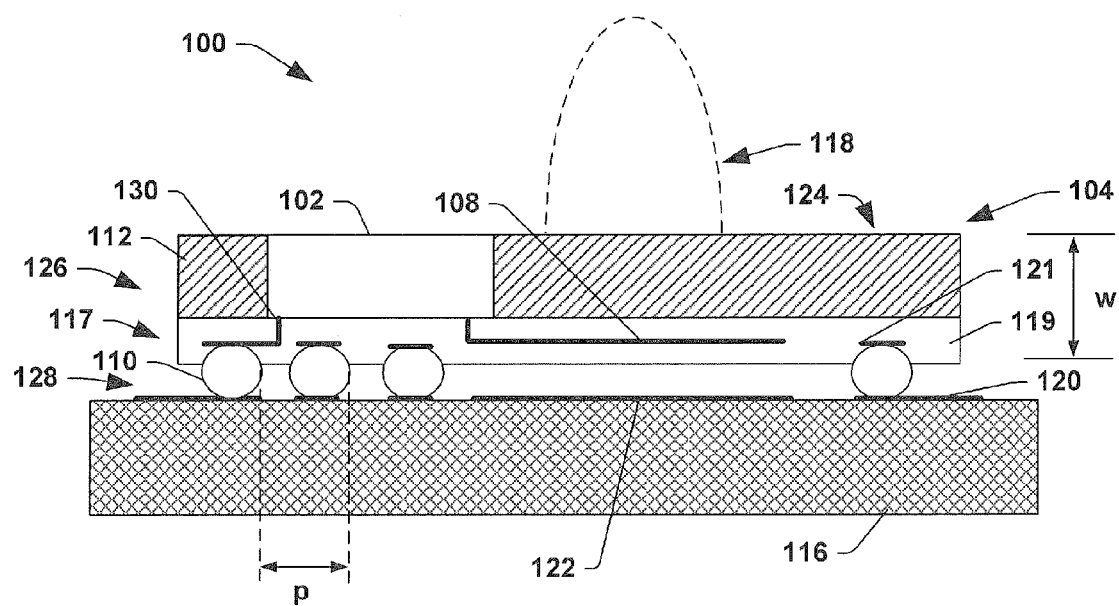
FIGS. 1b-1d illustrate various embodiments of a cross section of a semiconductor module in accordance with some aspects of the present disclosure.

Referring now to FIG. 1b, illustrates one embodiment of a cross-section of the semiconductor module 100 along the line 1b-1b. In the illustrative example of FIG. 1b, a printed circuit board substrate) 16 is coupled to the package 104 via solder balls 110 and interconnects 120. The package 104 (as discussed above) can comprise a package molding compound layer 126 that comprises the package molding compound 112 and the IC chip 102, and an interface layer 117 comprising a redistribution layer 121 with integrated structures coupled thereto and a dielectric coat 119.

The package molding compound 112 can have very low losses and is a very good substrate for applications requiring small packages, such as in RF or wireless communication chips (e.g. for microwave radar sensing). The package molding compound 112 can comprise an organic polymer, such as an epoxy material that has an inorganic filling material (e.g. silicon dioxide). The package molding compound layer 126 can have the IC chip 102 embedded within the package molding compound 112, wherein a substantially planar surface 124 can be formed thereat and during wafer package processing.

The package 104 further comprises the interface layer 114 on a surface of the package molding compound layer 126 that comprises a metal layer/plane or the redistribution layer 121 in the dielectric coating 121 where the contents from the chip 102 to the package 104 are connected and integrated. The package 104 comprising the redistribution layer 114 and the package molding compound layer 126 can have a width w of about 450 microns.

The package 104 also comprises the 3D interconnect structures 110 (e.g. solder balls) that add further dimension to the package 104. The balls 110 are the interface from the IC chip 102 to the external world (e.g. outside the package molding compound layer 104), and can have a diameter of about 300 microns. The distance between the balls can be about 0.5 mm, which is represented by a pitch p. This is a distance p in which the balls 110 are capable of connecting to a circuit board 116 and be compactly integrated into the package 104. The 3D bonding interconnect structures 110 can provide external contacts, mechanical support and/or spacing between the package 104 and external contacts 120 (e.g., package leads on a printed circuit board).

Figure 1C:
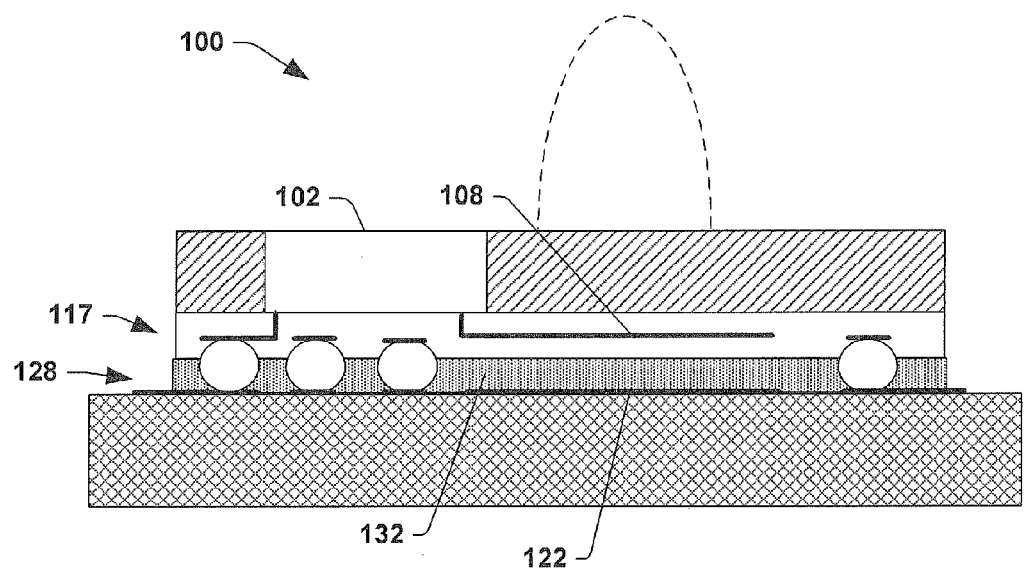

Between the package 104 and the printed circuit board 116 can be an air cavity 128. In one embodiment, the air cavity 128 can be filled with only air and/or a filler 132 (as illustrated in FIG. 1c), such as an under-fill comprising an epoxy compound (not shown). The printed circuit board (PCB) 116 can comprise a ground plane and/or reflector 112 positioned on the PCB 116 and within the air cavity 128. The reflector 122 can be opposite to and spaced from the integrated antenna structure 106 and/or 108 for providing a directive radiation 118 in a direction 118 from the package 104 and/or from the PCB 116. Without the ground place/reflector 122, the radiation of energy from antenna structures could be in both directions, to the top and through the package mold compound as well as through the back of the package. With the reflector 122, a directive radiation 118 is directed substantially perpendicular to the PCB or the package to the outside world. In one embodiment, further reflector structures (not shown) or additional metal layers within the interface layer 117, such as metal bars (not shown) may be placed on one side of the antenna structure 108 for further directing a directive radiation 118 to a specific direction.

In one embodiment, the antenna structure 108 is integrated with the package molding compound layer 126 and to the IC chip 102 within the interface layer 117 through the redistribution layer 114 therein. For example, the antenna structure 108 can be formed to the same redistribution layer 114 as the bonding interface structure comprising the solder balls or 3D interconnect structures 110. The integrated antenna structure 108 can thus be coupled to the IC chip 102 from the redistribution layer 121 via a metallization layer 130 within. Because the antenna structure 108 is integrated directly into the package 104, no additional substrate specific to the antenna structure 108 is needed. The metallization layer 130 can also comprise metal interconnects (e.g. copper) for connecting the 3D bonding interconnect structures 110 and/or the integrated antenna structure 108 to bond pad connections 116 of the IC chip 102.

By integrating the antenna structures directly to IC chip 102 in the package molding compound layer 104, no additional high frequency substrates or lossy interfaces are incorporated for integrating antennas. Thus, cost structures for design can be reduced. Additionally, low loss interconnects between antennas and a semiconductor device can be achieved by means of such high precision wafer level processed modules as discussed above. Consequently, applications (e.g. automotive safety, blind spot detection and/or park aiding) can be finally implemented without high frequency connections on the circuit board.

Referring to FIG. 1c, illustrates one embodiment of a cross-section of the semiconductor module 100 along lines 1b-1b that is similar to FIG. 1b. The air cavity/gap 128 is located between interface layer 117 and the ground plane/reflector 122. In one embodiment, an additional material is introduced that is a fill or an underfill 132, such that there is substantially less air or no air in the air cavity 128. By doing this, the radiation properties of the antenna can be changed. For example, the fill can be used to reduce the thermal stress between the PCB board 116 and the IC chip 102 (e.g. a flip chip device). With the fill 132, reliability can be improved with respect to temperature cycling. The fill 132 can be a type of epoxy or organic material. The fill 132 comprises a different dielectric constant than air (about 1). As a consequence, the effective electrical distance between the integrated antenna structure 108 and reflector 122 can be improved. For example, the effective electrical distance can be about a quarter of a wavelength of the antenna radiation.

Figure 1D:
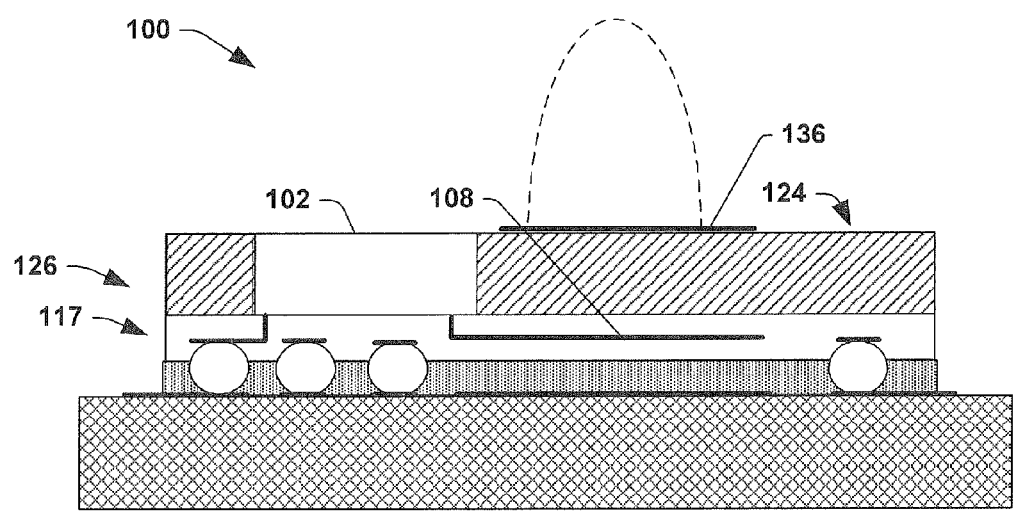

Referring now to FIG. 1d, illustrates another embodiment of a cross-section of the semiconductor module 100 along lines 1b-1b that is similar to FIG. 1b. FIG. 2d illustrates an embodiment of the module 100 further comprising at least one parasitic element 136 (e.g. a parasitic antenna structure) located on the surface 124 of the package molding compound layer 126 for modulating the field directivity of the directive radiation 118 of the integrated antenna structure 108. The surface 124 can be substantially planar and opposing another surface of the package molding compound layer 126 coupled to the interface layer. The parasitic element 138 can be further located opposite to the integrated antenna structure 108 and in a parallel configuration thereto.

The parasitic element 136 can be a radio antenna element, which does not have any wired input, but instead absorbs radio waves radiated from another active antenna element (e.g. integrated antenna 108) in proximity. Then, the element 136 can re-radiate radio waves in phase with the active element so that it adds to the total transmitted signal. This can change the antenna pattern and beam width. The parasitic element 136 can also be used to alter the radiation parameters of a nearby active antenna. For example, the parasitic element 136 can be a parasitic microstrip patch antenna located above the integrated antenna structure 108, which may can also be a patch antenna in one embodiment. This antenna combination resonates at a slightly lower frequency than the original element, and thus, can increase the impedance bandwidth of the integrated antenna structures embedded within the interface layer 117.

Figure 2A:
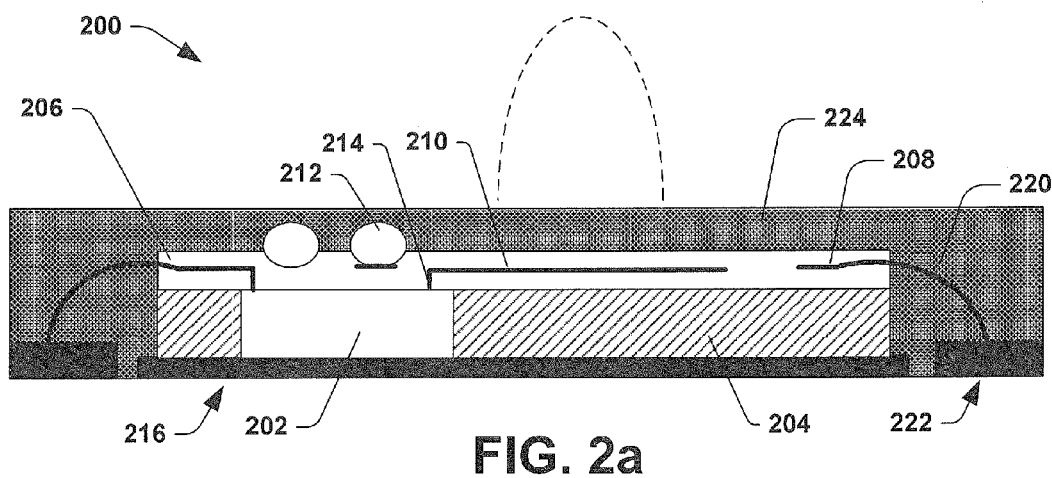
FIGS. 2a-2c illustrate various embodiments of a cross section of a semiconductor module in accordance with some aspects of the present disclosure.
Figure 2B:
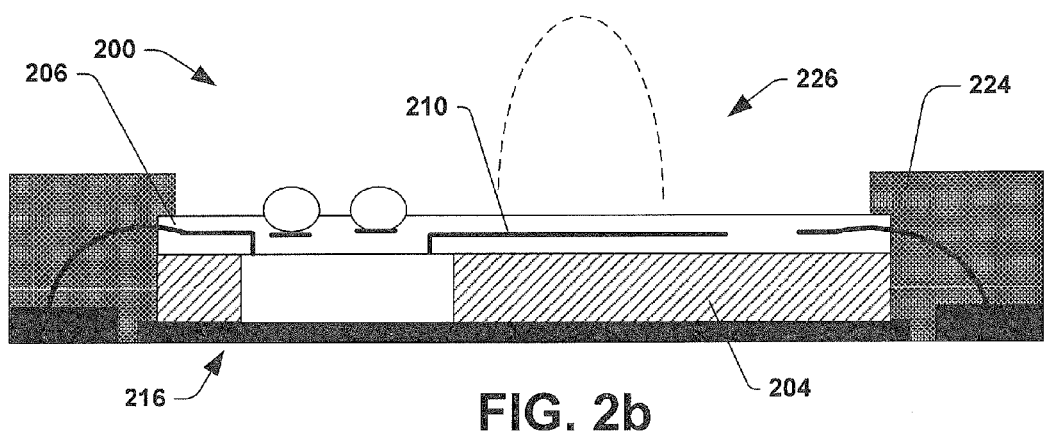
Figure 2C:
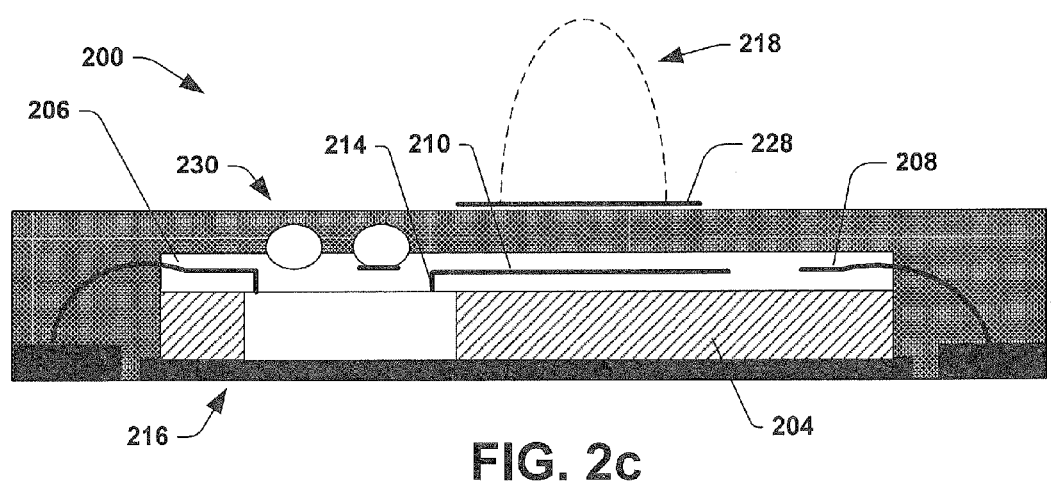

FIGS. 2a-2c illustrate different embodiments of a cross-sectional view of a semiconductor module 200 comprising integrated antenna structures, according to exemplary embodiments of the disclosure, and integrally packaged with an integrated circuit (IC) chip 202 for wireless communication. For example, the module 200 can comprise an integrated antenna structure 210 embedded within a wafer package layer 204 comprising an interface layer 206 coupled to the IC chip 202. Below the integrated antenna structure 210 is a ground plane/lead frame or reflector plate 216 for directing a directive radiation of the antenna.

The module 200 can comprise a bonding interface structure 222. The bonding interface structure 222 can further comprise an external contact for contacting surfaces external to the module 200, at least one bond wire 220, and at least one three dimensional (3D) interconnect 212 integrated within the interface layer 206. For example, the 3D interconnect 212 can comprise surface-mountable solder balls providing external contacts and a mechanical support structure.

In one embodiment, the 3D interconnect structure 212 can be integrated with the integrated antenna structure 206 and the IC chip 202 from within the interface layer 206. The interface layer 206 can comprise a dielectric and a redistribution layer 208 that connects components therein, such as the integrated antenna structure 210 and 3D interconnects 212. The redistribution layer 208 can comprise a metal plane (e.g. copper) for providing a metallization interconnect 214 integrating the components within the interface layer 206 to the IC chip 202.

In one embodiment, there is a reflector plate or ground plane 216 on a surface of the mold package layer 204 with the chip 202 embedded therein. The ground plane 216 can be used as reflector for the antenna and comprise a metal (e.g. copper) that can be any metal suitable for directing fields from a direction 218 through the mold compound within the mold package layer 204. The reflector plate 216 can be located opposite one side of the package molding compound layer 204 from the interface layer 206 coupled thereto and parallel to the integrated antenna structure 210 embedded within the interface layer 206.

In one embodiment, a second package molding compound layer 224 can be deposited. The second package molding compound layer 224 can encapsulate surfaces comprising the interface layer 206, the mold package compound layer 204, the reflector plate (e.g. ground plane) 216 and/or three dimensional interconnect structures 212. Alternatively, in one embodiment, a window 224 can be formed within the second package molding compound layer, as illustrated in FIG. 2b.

The window 224 can be an opening surrounding the interface layer 206 where the second package molding compound layer 224 is absent.

FIG. 2c illustrates one embodiment of the module 200 further comprising at least one parasitic antenna structure 228 located on a surface 230 of the second package molding compound layer 204 for modulating the field directivity 218 of the integrated antenna structure 210. The surface 230 is substantially planar, and the parasitic antenna structure 228 can be located opposite to the integrated antenna structure 210 and in a parallel configuration with it.

By integrating the antenna structures directly to the IC chip 202 from within the interface layer 206, no additional high frequency substrates or lossy interfaces need to be incorporated for integrating antennas. Thus, cost structures for design can be reduced. Additionally, low loss interconnects between antennas and a semiconductor device can be achieved by means of such high precision wafer level processed modules as discussed above. Consequently, applications can be implemented without high frequency connections on the circuit board.

Figure 4A:
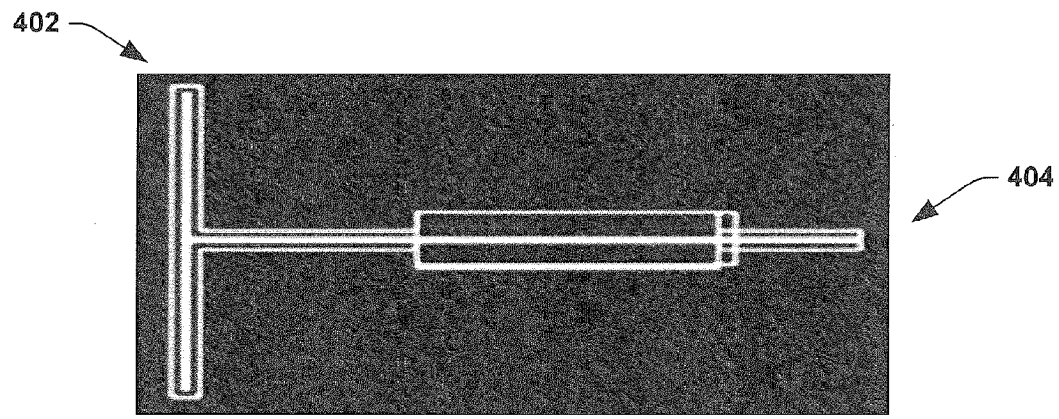
FIG. 4a illustrates an exemplary dipole antenna structure according to one aspect of the present disclosure.
Figure 4B:
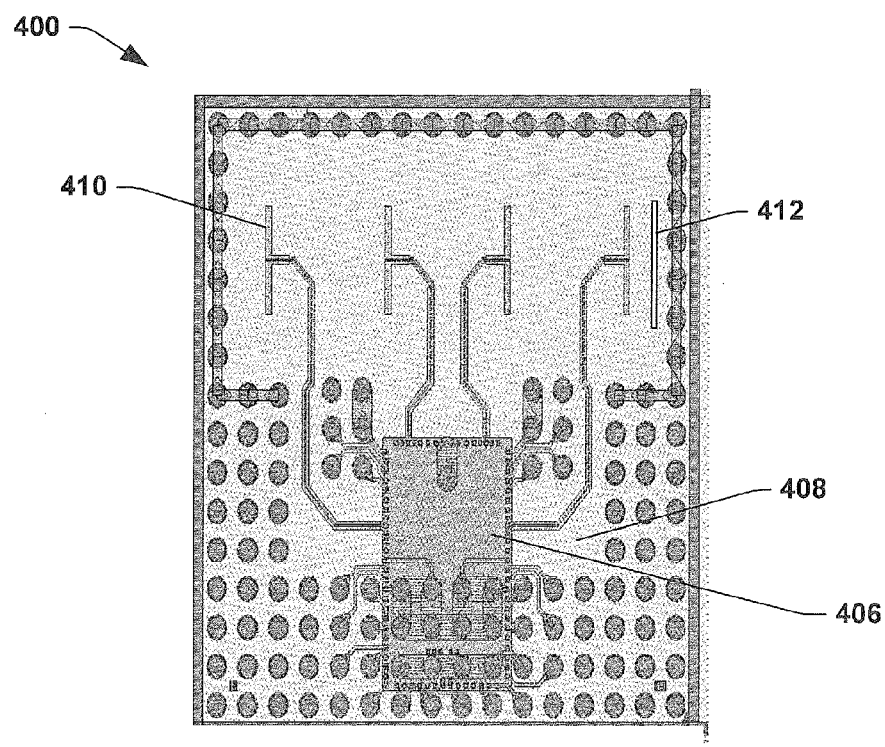
FIG. 4b illustrates an exemplary semiconductor module in accordance with one aspect of the present disclosure.
Figure 5:
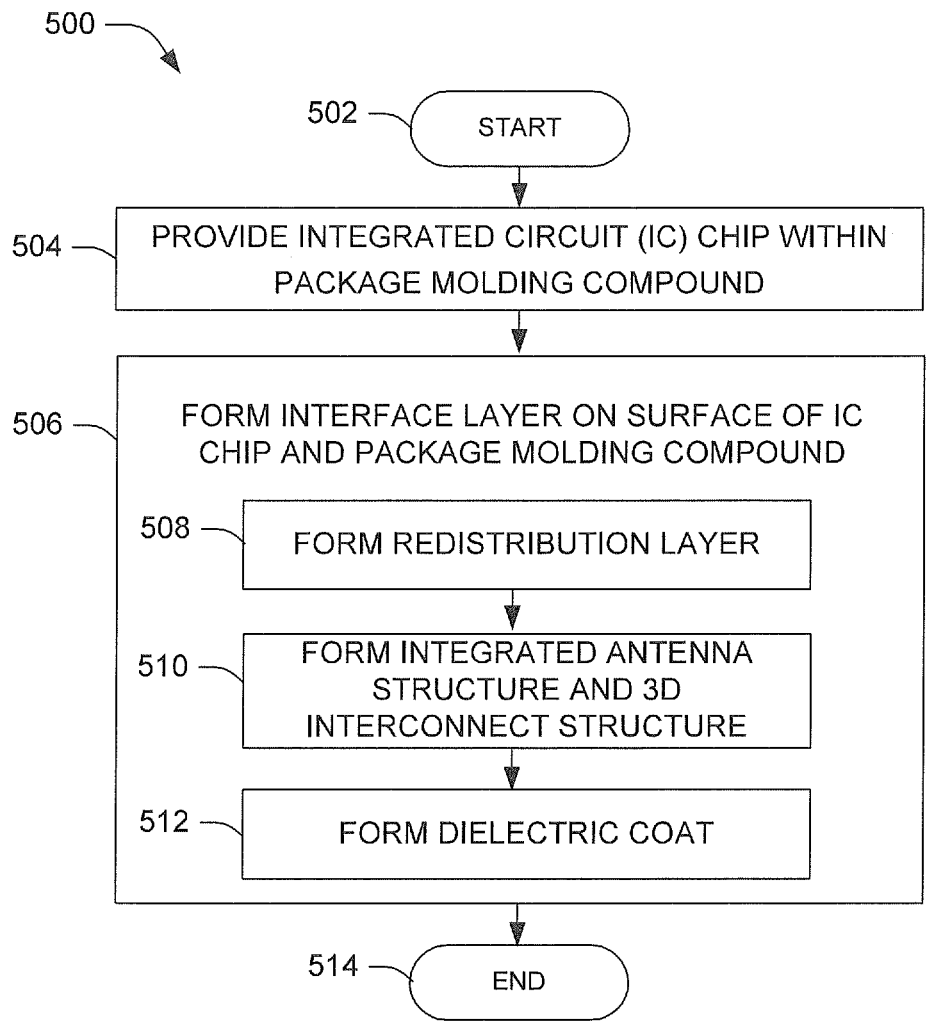
FIG. 5 is a flowchart illustrating a method of fabricating a semiconductor module in accordance with one aspect of the disclosure.

FIGS. 4a and 4b illustrate embodiments of an antenna structure with an antenna feed network formed within an interface layer of a wafer package. Although folded dipole antenna devices and integration of such devices in integrated circuit package are described, the present disclosure is not limited to any particular antenna type or operating frequency. Rather, the disclosure is applicable to any antenna type suitable for applications and various frequencies of operation.

FIG. 4a is a schematic diagram illustrating an exemplary antenna device comprising a folded dipole antenna 402 and feed network 404 comprising a differential line or a single ended line. The feed network 404 can additionally comprise a matching structure for various wavelengths. For example, the matching structure can be a quarter wavelength matching structure.

FIG. 4b illustrates a wafer package 400 with a silicon chip 406 embedded within a molding compound 408. Integrated to the chip 406 is an antenna structure 410 that is a folded dipole antenna, as illustrated in FIG. 4a. Although four antennas structures 410 are illustrated, this is only one embodiment and any number of antenna structures can be integrated. For example, at least one antenna structures can be integrated in the package and connected to the chip 406.

In one embodiment, the antenna structure 410 comprises at least one metal bar 412 integrated into the package 400. The metal bar 412 can be used for limiting the effect of waves propagating from the antenna structure 410 and providing a directive gain in the direction desired.

Now that some examples of systems in accordance with aspects of the invention have been discussed, reference is made to FIG. 7, which shows a method in accordance with some aspects of the invention. While this method is illustrated and described below as a series of acts or events, the present invention is not limited by the illustrated ordering of such acts or events. For example, some acts may occur in different orders and/or concurrently with other acts or events apart from those illustrated and/or described herein. In addition, not all illustrated acts may be required to implement a methodology in accordance with one or more aspects of the present invention. Further, one or more of the acts depicted herein may be carried out in one or more separate acts or phases.

The method 500 for fabricating a semiconductor module initializes at 502. An integrated circuit (IC) chip is provided at 504 and embedded within a package molding compound. Together the molding compound and IC chip can have a surface that is planar.

At 506 an interface layer is formed within the same package for integrating components therein to the chip within the molding compound. The interface layer is formed on the surface and coupled to the IC chip and the package molding compound. The method of forming the interface layer begins at 508 and comprises forming a redistribution layer. This layer can be a metallization layer formed from a metal plane, for example a copper plate therein. This layer provides the metallization interconnecting components of the interface layer to the IC chip. For example, at 510 at least one antenna structure is integrated to the IC chip within the package through the redistribution layer of the package. Additionally, a three dimensional (3D) interconnect structure (e.g. solder balls) are also formed and integrated with the IC chip through the redistribution layer. At 512 a dielectric or insulating coat can be formed. These processes steps, as mentioned above do not need to be in the order represented and such flow is only meant to provide an example of the method process 500. For example, a dielectric coat can be formed in place of 508 instead of at 512, and an antenna structure can be formed before or at the same time as a 3D interconnect structure. No particular sequence is required and any combination can be appreciated by one of ordinary skill in the art.

In addition, a second molding compound layer can be formed that surrounds the interface layer with the integrated antenna structure embedded therein, the mold package compound, the bonding interface structure and a ground plane formed. A parasitic antenna can be located on a surface over the integrated antenna structure and in a parallel configuration thereto.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A semiconductor module, comprising:
    a package molding compound layer comprising an integrated circuit (IC) device embedded within a package molding compound, the integrated circuit device and the package molding compound having a common surface;
    structures to connect the semiconductor module to an external board, the structures electrically connected to the integrated circuit device; and
    a layer formed on the common surface, the layer comprising at least one integrated antenna structure, the integrated antenna structure coupled to the IC device, the module further comprising at least one parasitic antenna structure located on a surface of the package molding compound layer for modulating a field directivity of the integrated antenna structure;

wherein the surface on which the at least one parasitic antenna structure is located is substantially planar and the parasitic antenna structure is located opposite to the integrated antenna structure and in a parallel configuration thereto, and wherein the surface on which the at least one parasitic antenna structure is located opposes another surface of the package molding compound layer coupled to the layer formed on the common surface.

2. The module of claim 1, wherein the structures are provided lateral to the integrated circuit device.

3. The module of claim 1, wherein the layer formed on the common surface comprises a dielectric coat.

4. The module of claim 1, wherein the structures comprises surface-mountable solder balls providing external contacts and a mechanical support structure with at least one bond wire.

5. The module of claim 1, wherein a further layer is located on a surface of the package molding compound layer opposite to the common surface, the further layer comprising metal.

6. The module of claim 5, wherein the further layer comprises bonding interface structures connected to the integrated circuit device, the bonding interface structures provided for contacting surfaces external to the module.

7. The module of claim 1, wherein the integrated antenna structure is formed lateral to the IC device.

8. The module of claim 1, wherein the integrated antenna structure is formed outside of an area in which the structures to connect the semiconductor module to an external board are formed.

9. The module of claim 1, wherein the module is a wafer-level package module.

10. The module of claim 9, wherein the IC device is a monolithic microwave integrated circuit device.

11. The semiconductor module of claim 1, wherein at least a part of the structures to connect the semiconductor module to an external board are arranged to surround the IC device and the integrated antenna structure.

12. A method for fabricating a semiconductor module, the method comprising:
   providing an integrated circuit (IC) device within a package molding compound layer, the package molding compound layer and the integrated circuit device having a common surface;
   forming a further layer on the common surface, the further layer comprising metal:
      forming at least one integrated antenna structure coupled to the IC device, the integrated antenna structure formed by structures of the further layer;
      depositing a dielectric coat to cover the integrated antenna structure; and
      forming at least one parasitic antenna structure located on a surface of the package molding compound layer to modulate a field directivity of the integrated antenna structure;
      wherein the at least one parasitic antenna structure is located opposite to the integrated antenna structure and in a parallel configuration thereto.

13. A semiconductor module, comprising:
a wafer level package comprising an integrated circuit (IC) device embedded within the wafer level package, the integrated circuit device and the wafer level package having a common surface;
structures to connect the semiconductor module to an external board, the structures electrically connected to the integrated circuit device; and
a layer formed on the common surface, the layer comprising at least one integrated antenna structure, the integrated antenna structure coupled to the IC device;
at least one parasitic antenna structure located on a surface of the wafer level package to modulate a field directivity of the integrated antenna structure;
wherein the parasitic antenna structure is located opposite to the integrated antenna structure and in a parallel configuration thereto.

* * * * *